United States Patent
Song et al.

(10) Patent No.: US 7,564,185 B2
(45) Date of Patent: Jul. 21, 2009

(54) ORGANIC ELECTROLUMINESCENCE DISPLAY DEVICE AND MANUFACTURING METHOD THEREOF

(75) Inventors: Seung Yong Song, Yongin-si (KR); Deuk Jong Kim, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 469 days.

(21) Appl. No.: 11/540,383

(22) Filed: Sep. 29, 2006

(65) Prior Publication Data

US 2007/0194710 A1 Aug. 23, 2007

(30) Foreign Application Priority Data

Feb. 20, 2006 (KR) .................. 10-2006-0016316
Mar. 2, 2006 (KR) .................. 10-2006-0020109

(51) Int. Cl. *H01J 1/62* (2006.01)
(52) U.S. Cl. .................. 313/506; 313/504
(58) Field of Classification Search .......... 313/498, 313/504, 506, 509, 512
See application file for complete search history.

(56) References Cited

U.S. PATENT DOCUMENTS

| | | | |
|---|---|---|---|
| 4,238,704 A | 12/1980 | Bonk et al. | |
| 5,811,927 A * | 9/1998 | Anderson et al. | 313/495 |
| 6,515,417 B1 * | 2/2003 | Duggal et al. | 313/506 |
| 6,555,025 B1 | 4/2003 | Krupetsky et al. | |
| 6,998,776 B2 | 2/2006 | Aitken et al. | |
| 7,098,589 B2 * | 8/2006 | Erchak et al. | 313/498 |
| 2004/0169174 A1 | 9/2004 | Huh et al. | |
| 2005/0233885 A1 | 10/2005 | Yoshida et al. | |

FOREIGN PATENT DOCUMENTS

| | | |
|---|---|---|
| JP | 09-278483 | 10/1997 |
| JP | 10-074583 | 3/1998 |
| KR | 10-2001-0084380 A | 9/2001 |
| KR | 10-2002-0051153 A | 6/2002 |
| KR | 10-2004-0011138 A | 2/2004 |

* cited by examiner

*Primary Examiner*—Vip Patel
(74) *Attorney, Agent, or Firm*—Knobbe Martens Olson & Bear LLP

(57) ABSTRACT

An organic electroluminescence display device, and a manufacturing method thereof. An organic electroluminescence display device includes a first substrate formed with an organic electroluminescence element having a first electrode, an organic thin film layer and a second electrode and a metal wiring for transmitting signals to the organic electroluminescence element, a second substrate arranged in an upper side of the first substrate, a frit provided between the first substrate and the second substrate, a reflective layer and a protective film provided between the metal wiring and the frit, wherein the first substrate and the second substrate are attached to each other by the frit.

21 Claims, 19 Drawing Sheets

ORGANIC ELECTROLUMINESCENCE DISPLAY DEVICE AND MANUFACTURING METHOD THEREOF

CROSS-REFERENCE TO RELATED APPLICATIONS

This application claims the benefit of Korean Patent Application Nos. 10-2006-0016316, filed on Feb. 20, 2006, and 10-2006-0020109, filed on Mar. 2, 2006 in the Korean Intellectual Property Office, the disclosures of which are incorporated herein by reference in its entirety.

BACKGROUND

1. Field

The invention relates to an organic electroluminescence display device and a manufacturing method thereof, and more specifically, to an organic electroluminescence display device encapsulated by a frit and a manufacturing method thereof.

2. Discussion of the Related Technology

In general, organic electroluminescence display devices comprise a substrate on which a pixel region and a non-pixel region are provided, and a vessel or another substrate arranged to be opposite to the substrate and attached to the substrate by a sealant such as epoxy for its encapsulation.

On the pixel region of the substrate is formed multiple light-emitting elements connected in a matrix form between a scan line and a data line, the light-emitting elements comprising an anode electrode, a cathode electrode, and an organic thin film layer formed between the anode electrode and cathode electrode. The organic thin film layer generally comprising an hole transport layer, an organic light-emitting layer and an electron transport layer.

The light-emitting elements configured as described above are vulnerable to oxygen exposure because the organic materials are easily oxidized by moisture in the air. In addition, the cathode electrode is generally made of metal materials, subject to oxidation which can cause deterioration to electrical and light-emitting properties. To avoid the above problems, a powder-type moisture absorbent or a film-type moisture absorbent is generally provided on a vessel manufactured in the form of a metal material can or cup, or a substrate made of glass, plastic, etc. to get rid of moisture, oxygen and hydrogen from the exterior.

However, such methods of coating the powder-type moisture absorbent generally involves relatively complicated processes and raises cost for materials and the processes. In addition, such methods result in the increase of the thickness of the display device and is difficult to be applied to an screen light-emitting type display. In addition, such methods of attaching the film-type moisture absorbent have limited capability to eliminate all moisture and also have low durability and reliability. This further limits use of such methods in large scale production. The above discussion is simply to describe the general field of light emitting displays and is not a discussion of the prior art.

Methods have been developed which encapsulate light-emitting elements by forming side walls with frits to overcome the afore-mentioned problems.

International patent application No. PCT/KR2002/000994 (May 24, 2002) discloses an encapsuation container formed with side walls using a glass frit and a manufacturing method thereof.

U.S. patent application Ser. No. 10/414,794 (Apr. 16, 2003) discloses a glass package encapsulated by attaching a first and a second glass plates through a frit and a manufacturing method thereof.

Korean patent laying-open gazette No. 2001-0084380 (Sep. 6, 2001) discloses a frit frame encapsulation method using a laser.

Korean patent laying-open gazette No. 2002-0051153(Jun. 28, 2002) discloses a packaging method of encapsulating an upper substrate and a lower substrate with a frit layer using a laser.

SUMMARY OF CERTAIN INVENTIVE ASPECTS

Embodiments of the invention provide an organic electroluminescence display device which inhibits damage to metal wirings due to heat by avoiding the metal wirings of a lower part of a frit and a part intersecting the frit from being directly exposed to heat, and a manufacturing method thereof.

An organic electroluminescence display device according to one embodiment comprises a first substrate formed with an organic electroluminescence element, a metal wiring for conducting signals to the organic electroluminescence element, a second substrate arranged on an upper side of the first substrate, a frit provided between the first substrate and the second substrate, and a reflective layer formed between the metal wiring and the frit.

An organic electroluminescence display device according to another embodiment comprises a first substrate formed with an organic electroluminescence element, a transistor for controlling the operation of the organic electroluminescence element and a metal wiring for transmitting signals to the organic electroluminescence element, a second substrate arranged in a upper side of the first substrate, a frit provided between the first substrate and the second substrate, and a reflective layer formed between the metal wiring and the frit.

An organic electroluminescence display device according to still another embodiment comprises a first substrate formed with an organic electroluminescence element comprising a first electrode, an organic thin film layer and a second electrode and a metal wiring for conducting signals to the organic electroluminescence element, a second substrate arranged at a upper side of the first substrate, a frit provided between the first substrate and the second substrate, a reflective layer provided between the metal wiring and the frit, and a protective film formed on the reflective film.

An organic electroluminescence display device according to a further embodiment comprises a first substrate formed with an organic electroluminescence element comprising a first electrode, an organic thin film layer and a second electrode, a transistor for controlling the organic electroluminescence element and a metal wiring for transmitting signals to the organic electroluminescence element, a second substrate arranged in a upper side of the first substrate, a frit provided between the first substrate and the second substrate, a reflective layer provided between the metal wiring and the frit, and a protective film formed on the reflective film.

A manufacturing method of an organic electroluminescence display device according one embodiment comprises providing an organic electroluminescence element on a pixel region of a first substrate and providing a wiring connected to the organic electroluminescence element on a non-pixel region of the first substrate, providing a reflective layer on an upper surface of the non-pixel region including the wiring, forming a frit along a surrounding of the second substrate, and arranging the second substrate on an upper side of the first substrate and attaching the frit to the first substrate.

A manufacturing method of an organic electroluminescence display device according to another embodiment comprises forming an organic electroluminescence element on a pixel region of a first substrate and a transistor for controlling the organic electroluminescence element, and a metal wiring for transmitting signals to the organic electroluminescence element on a non-pixel region, forming a reflective layer on the upper surface of the non-pixel region including the wiring, forming a frit along a surrounding of the second substrate, arranging the second substrate on an upper side of the first substrate and then attaching the frit to the first substrate.

A manufacturing method of an organic electroluminescence display device according to a further embodiment forming a buffer layer on a first substrate including a pixel region and a non-pixel region, forming a semiconductor layer on the buffer layer of the pixel region and then forming a gate insulating film on the upper surface of the non-pixel region, forming a gate electrode and a first metal wiring on the gate insulating film of the pixel region and forming on the gate insulating film of the non-pixel region the first metal wiring extended from the first metal wiring of the pixel region, forming a between-layer insulating film on the upper surface of the pixel region and then forming a contact hole so that a predetermined portion of the semiconductor layer is exposed, forming on the between-layer insulating film of the pixel region a source and drain electrodes and a second metal wiring connected through the contact hole to the semiconductor layer and forming on the gate insulating film of the non-pixel region the second metal wiring extended from the second metal wiring of the pixel region, forming a reflective layer on the upper surface of the non-pixel region including the first and second metal wirings, forming a flattened layer on the upper surface of the pixel region and then forming a via hole so that the source and drain electrodes are exposed, forming an inorganic electrode layer on the upper surface of the pixel region and non-pixel region and then patterning the inorganic electrode layer, with a first electrode formed on the pixel region, the first electrode connected through the via hole to the source or drain electrode, and with a protective film formed on the non-pixel region, forming an organic thin film layer and a second electrode on the first electrode, forming a frit along a surrounding of the second substrate, and arranging the second substrate on an upper surface of the first substrate and then attaching the frit to the first substrate.

BRIEF DESCRIPTION OF THE DRAWINGS

These and other aspects and advantages of the invention will become apparent and more readily appreciated from the following description of the embodiments, taken in conjunction with the accompanying drawings of which:

FIGS. 2b and 3b are sectional views for illustrating FIGS. 2a and 3a.

FIGS. 11b and 12b are sectional views for illustrating FIGS. 11a and 12a.

DETAILED DESCRIPTION OF CERTAIN EMBODIMENTS

A method for encapsulating a light emitting element using a frit, which attaches a substrate on which the frit is coated to another substrate on which light emitting elements are formed, and then causes the frit to be fused and attached to the substrates by illuminating a laser beam, has a limitation in that when the laser beam is irradiated to the frit, metal wirings 10 of a lower part of the frit 20 and a part (region 'A' FIG. 1) intersecting the frit may be directly exposed by heat due to the laser beam, possibly resulting in heat damage. The thusly heat damaged metal wirings may develop cracks or their resistance and electrical properties can be changed, thus compromising the electrical properties and reliability of elements.

Embodiments provide an organic electroluminescence display device capable of mitigating the above problems, and a manufacturing method thereof.

Hereafter, embodiments of the invention will be described in a more detailed manner with reference to the accompanying drawings. It should be understood that the following embodiments will be provided to allow those skilled in the art to fully understand the invention, but the invention is not limited thereto, and various modifications can be made.

An organic light emitting display (OLED) is a display device comprising an array of organic light emitting diodes. Organic light emitting diodes are solid state devices which include an organic material and are adapted to generate and emit light when appropriate electrical potentials are applied.

Figure 18:
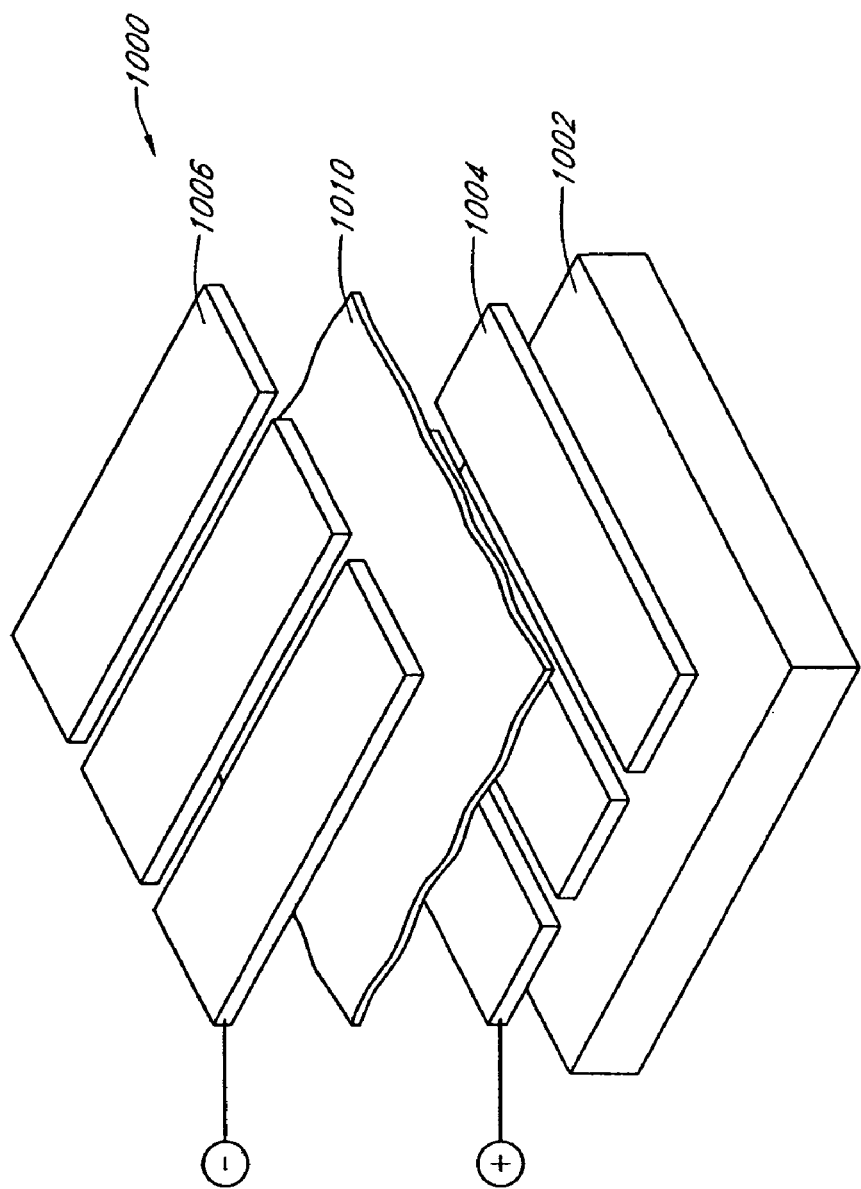
FIG. 18 is a schematic exploded view of a passive matrix type organic light emitting display device in accordance with one embodiment.
Figure 19:
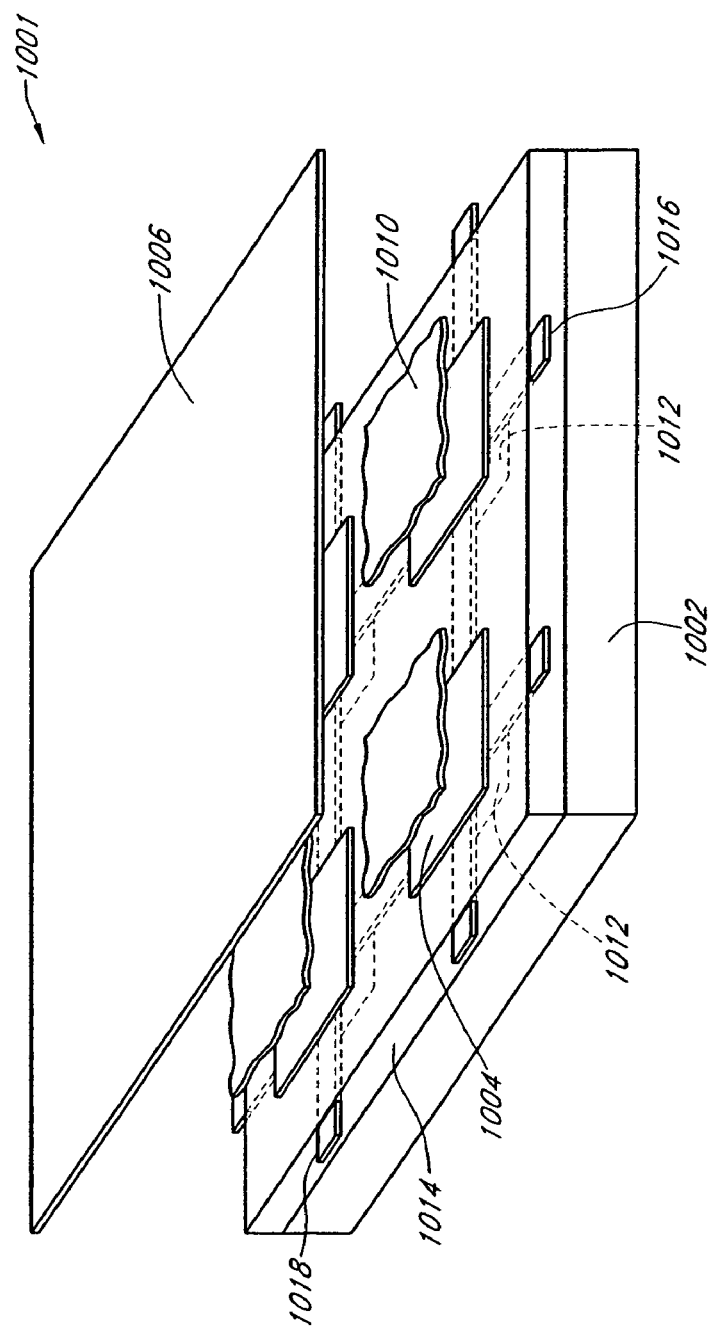
FIG. 19 is a schematic exploded view of an active matrix type organic light emitting display device in accordance with one embodiment.

OLEDs can be generally grouped into two basic types dependent on the arrangement with which the stimulating electrical current is provided. FIG. 18 schematically illustrates an exploded view of a simplified structure of a passive matrix type OLED 1000. FIG. 19 schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 18, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 19, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 20:
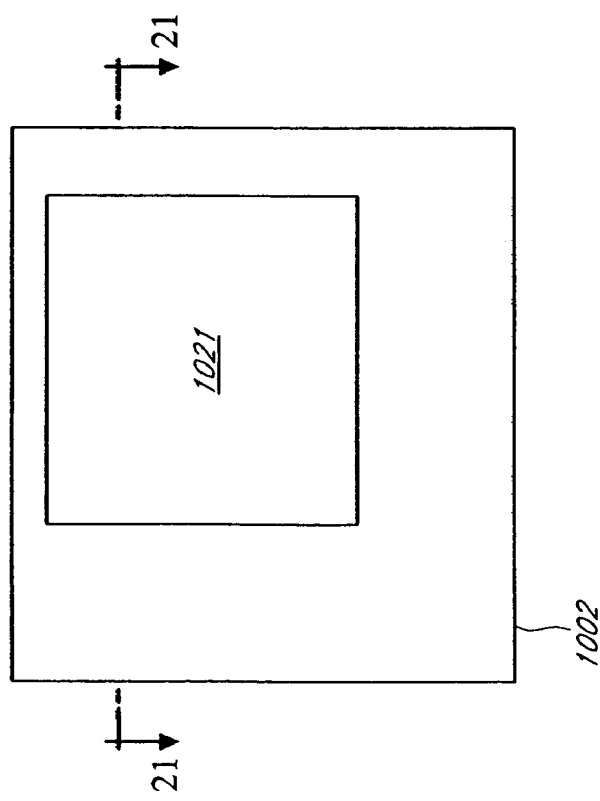
FIG. 20 is a schematic top plan view of an organic light emitting display in accordance with one embodiment.

In many embodiments, an OLED pixel array 1021 comprising a plurality of organic light emitting pixels is arranged over a substrate 1002 as shown in FIG. 20. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 21:
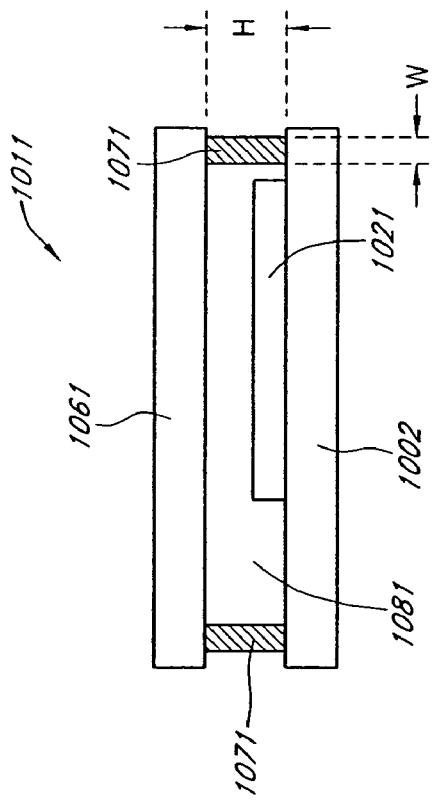
FIG. 21 is a cross-sectional view of the organic light emitting display of FIG. 20, taken along the line 21-21.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 21 schematically illustrates a cross-section of an encapsulated OLED device 1011 having a layout of FIG. 20 and taken along the line 21-21 of FIG. 20. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 21. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 21. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide ($MgO$), calcium oxide ($CaO$), barium oxide ($BaO$), lithium oxide ($Li_2O$), sodium oxide ($Na_2O$), potassium oxide ($K_2O$), boron oxide ($B_2O_3$), vanadium oxide ($V_2O_5$), zinc oxide ($ZnO$), tellurium oxide ($TeO_2$), aluminum oxide ($Al_2O_3$), silicon dioxide ($SiO_2$), lead oxide ($PbO$), tin oxide ($SnO$), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide ($CuO$), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 22:
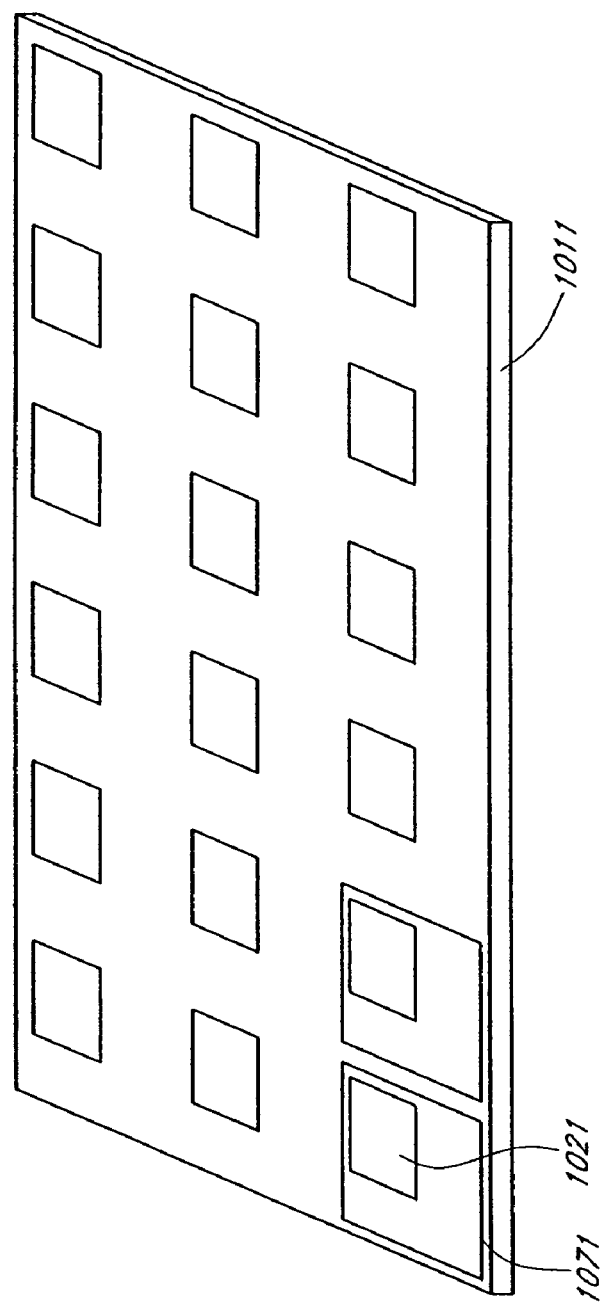
FIG. 22 is a schematic perspective view illustrating mass production of organic light emitting devices in accordance with one embodiment.

In some embodiments, OLED devices 1011 are mass produced. In an embodiment illustrated in FIG. 22, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 21. In certain embodiments, the individual OLED devices 1011 then further undergo additional packaging operations to further improve the sealing formed by the frit seal 1071 and the top and bottom substrates 1061, 1002.

Figure 1:
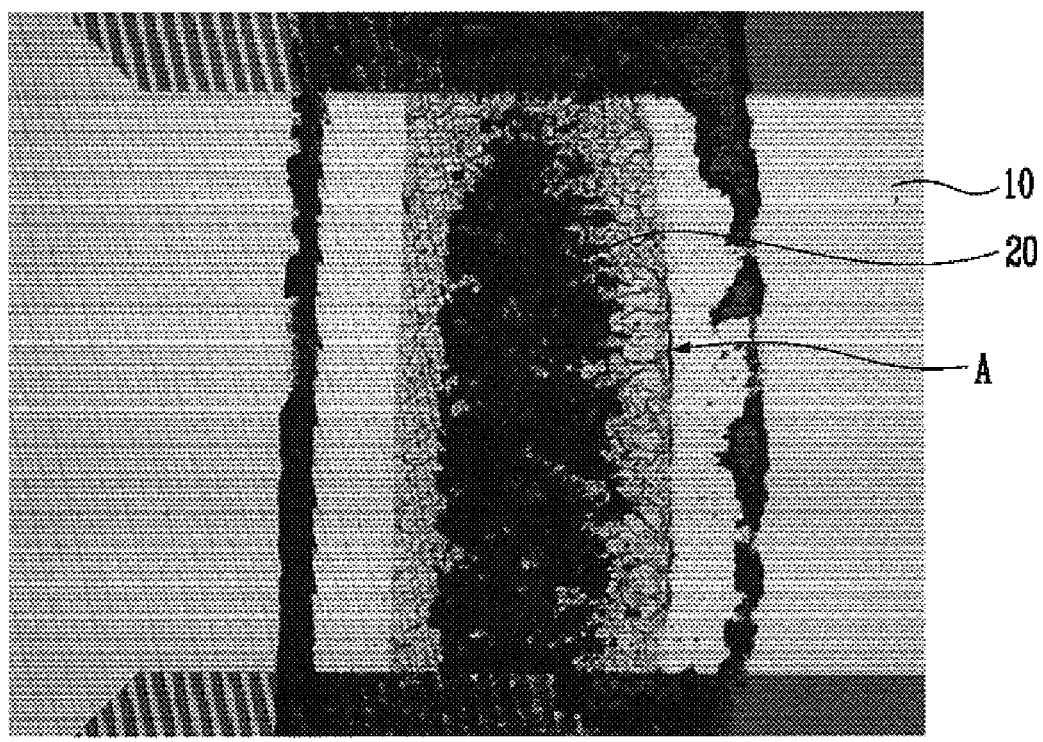
FIG. 1 is a picture for illustrating damage to a metal wiring by irradiating a laser beam.
Figure 2A:
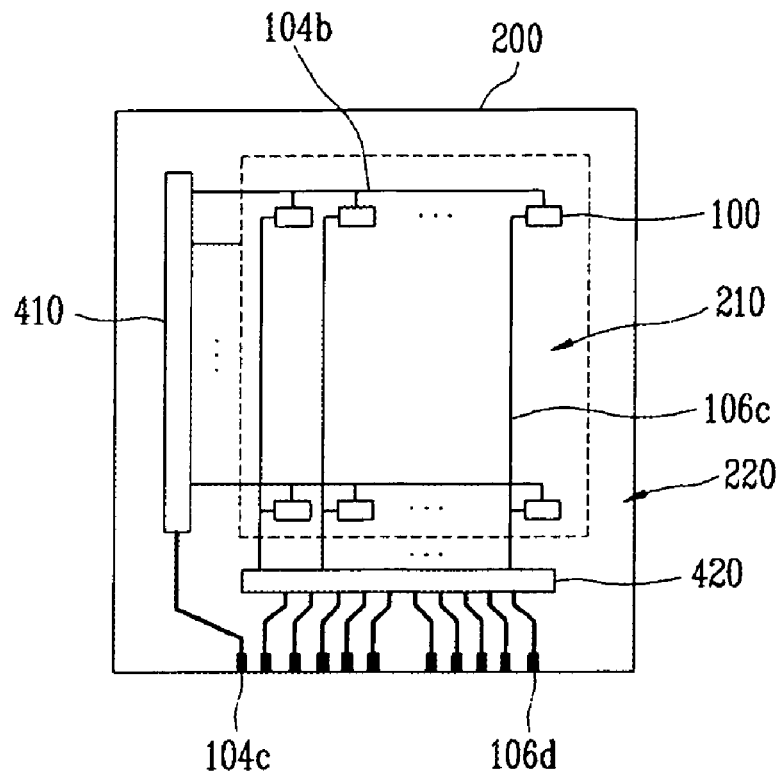
FIGS. 2a, 3a and 4 are plan views of illustrating an organic electroluminescence display device according to one embodiment of the invention.
Figure 3A:
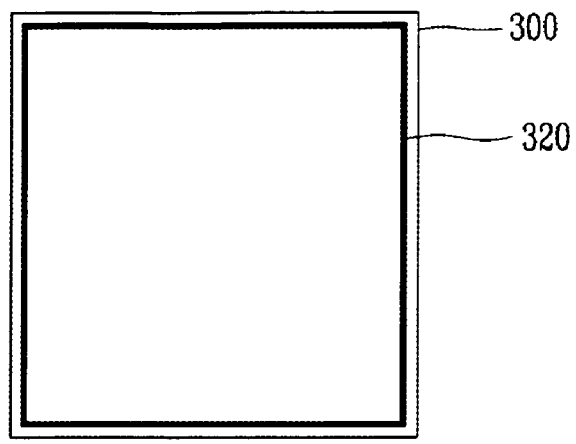
Figure 3B:
Figure 4:
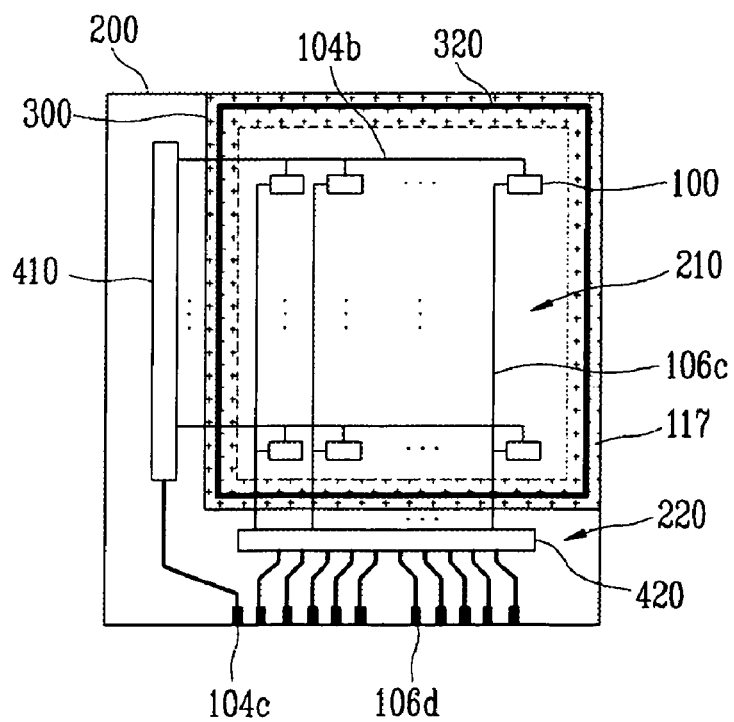

FIG. 1 is a picture for illustrating damage to a metal wiring by irradiating a laser beam. FIGS. 2a, 3a and 4 are plan views illustrating an organic electroluminescence display device according to one embodiment of the invention, and FIGS. 2b and 3b are sectional views for illustrating FIGS. 2a and 3a.

Referring to FIG. 2a, a substrate 200 defines a pixel region 210 and a non-pixel region 220. The non-pixel region 220 is a remaining region excluding the pixel region 210, and may be a peripheral region of the pixel region 210 or a region surrounding the pixel region 210. Multiple organic electroluminescence elements 100 are formed between a scan line 104b and a data line 106c on the pixel region 210 of the substrate 200. On the non-pixel region 220 of the substrate 200 are formed a scan line 104b and a data line 106c extended from the scan line 104b and the data line 106c, respectively, of the pixel region 210, a power supply line (not shown) for generating the organic electroluminescence elements 100, and a scan driver 410 and a data driver 420 for processing signals from the exterior through pads 104c and 106d and supplying them to the scan line 104b and data line 106c.

Figure 2B:
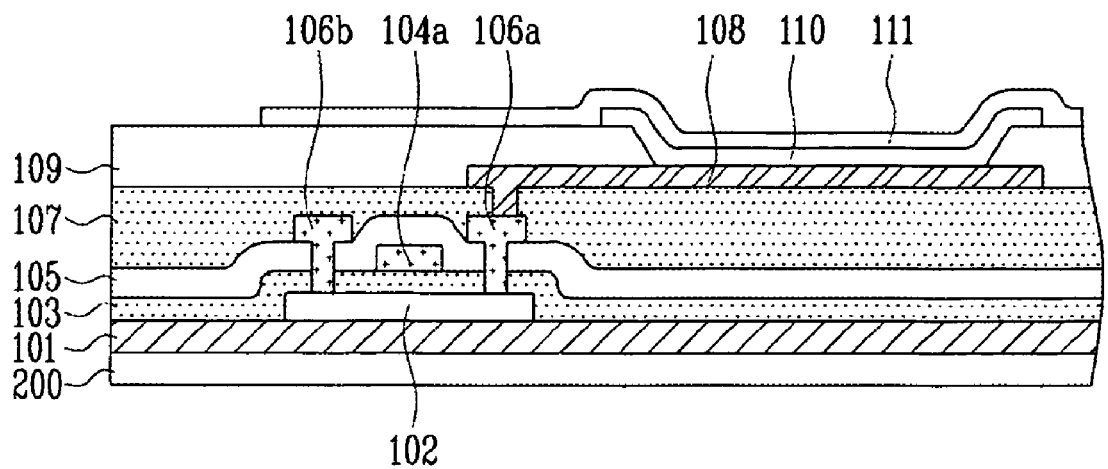

Referring to FIG. 2b, the organic electroluminescence element 100 is composed of an anode electrode 108 and cathode electrode 111, and an organic thin film layer 110 formed between the anode electrode 108 and cathode electrode 111. The organic thin film layer 110 is formed as a structure in which a hole transport layer, an organic light-emitting layer and an electron transport layer are deposited, and may further comprise a hole injection layer and an electron injection layer.

In a passive matrix type, the organic electroluminescence element 100 as configured above is connected in a matrix form between a scan line 104b and a data line 106c, and in an active matrix type, the organic electroluminescence element 100 is connected in a matrix form between the scan line 104b and data line 106c, the active matrix type further comprising a thin film transistor TFT for controlling the organic electroluminescence element 100 and a capacitor for sustaining a signal. The thin film transistor comprises a source, a drain and a gate. A semiconductor layer 102 provides a source and drain regions, to which a source and drain electrodes 106a and 106b, and a channel region, on an upper side of which is a gate electrode 104a electrically insulated from the semiconductor layer 102 by a gate insulation film 103.

Referring to FIGS. 3a and 3b, on the encapsulation substrate 300 is formed a frit 320 along the surrounding of the encapsulation substrate 300. The frit 320 encapsulates the pixel region 210 to inhibit oxygen and moisture from penetrating into the organic electroluminescence element 100, which is formed to surround an external side of the pixel region 210 and may be formed of a material, for example, such as a glass frit doped with at least one kind of transition metal, which may be fused by laser beam or infrared ray.

Referring to FIG. 4, the encapsulation substrate 300 is arranged on the upper side of the substrate 200. The encapsulation substrate 300 is arranged on the upper side of the substrate 200 so as to be superposed to the pixel region 210 and a part of the non-pixel region 220. A reflective layer 117 made of a metal having low heat absorption ratio and high reflectivity is provided between the frit 320 and the scan line 104b, data line 106c and the power supply line formed on the non-pixel region 220. Although most metals can reflect light, one embodiment employs a single layer or stacking structure of metals having low heat absorption ratio and high reflectivity, for example, such as metals selected from a group comprising Cu, Au, Al, Ag, etc, and/or alloys of these metals.

As described above, a laser beam and/or infrared ray is irradiated under a condition where the encapsulation substrate 300 is attached onto the substrate 200, such that the frit 320 is fused and attached to the substrate 200.

A manufacturing method of an organic electroluminescence display device configured as above will be described below with reference to FIGS. 5a through 5g and FIGS. 6a and 6b in accordance with one embodiment.

Figure 5A:
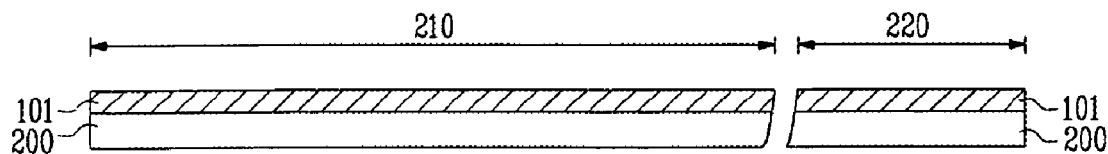
FIGS. 5a through 5g and FIG. 7 are plan views of illustrating a manufacturing method of an organic electroluminescence display device according to one embodiment of the invention.
Figure 6A:
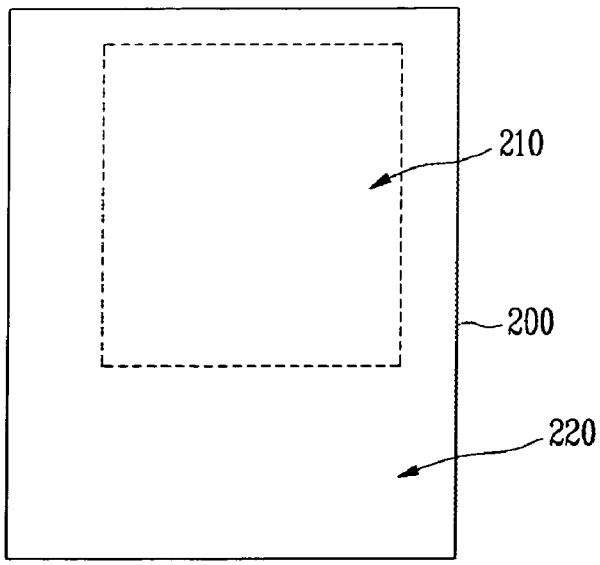
FIGS. 6a and 6b are plane views for illustrating FIGS. 5a and 5e.

Referring to FIGS. 5a and 6a, a substrate 200 is prepared, on which a pixel region 210 and a non-pixel region 220 are defined. The non-pixel region 220 is a remaining region except for the pixel region 210, which may be defined as a predetermined peripheral region of the pixel region 210 or a region surrounding the pixel region 210. A buffer layer 101 is formed on the pixel region 210 and non-pixel region 220 of the substrate 200. The buffer layer 101, which serves to inhibit the damage to the substrate 200 due to heat and isolate diffusion of ions from the substrate 200 to the outside, is formed as an insulating film such as silicon oxide film SiO2 and/or silicon nitride film SiNx.

Figure 5B:
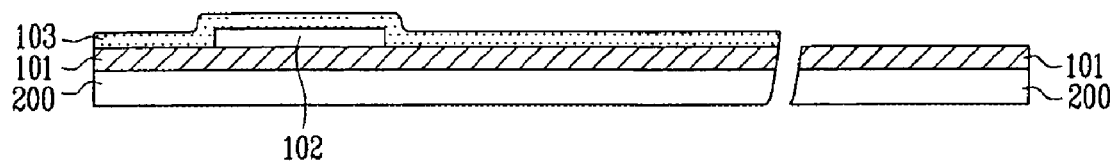

Referring to FIG. 5b, a semiconductor layer 102, which provides an active layer, is formed on the buffer layer 101 of the pixel region 210, and then a gate insulating film 103 is formed on the upper surface of the pixel region 210 including the semi conductor layer 102. The semiconductor layer 102 provides a source and drain regions and a channel region for a thin film transistor.

Figure 5C:
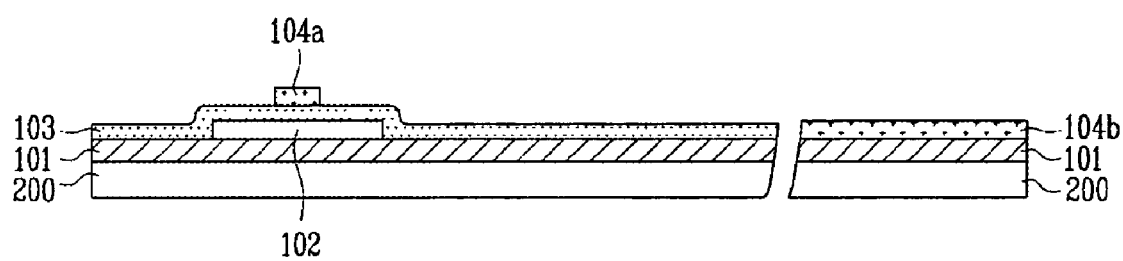

Referring to FIG. 5c, a gate electrode 104a is formed on the gate insulating film 103 placed on the upper side of the semiconductor layer 102. On the pixel region 210 is formed a scan line connected to the gate electrode 104a and on the non-pixel region 220 are formed a scan line 104 extended from the scan line 104 of the pixel region 210 and a pad 104c to receive signals from the exterior. The gate electrode 104a, scan line 104b and pad 104c are made of metals such as Mo, W, Ti, Al, and/or alloys thereof, and can be formed as an stacking structure. The non-pixel region 220 of FIG. 5c is a sectional surface of a part formed with the scan line 104b.

Figure 5D:
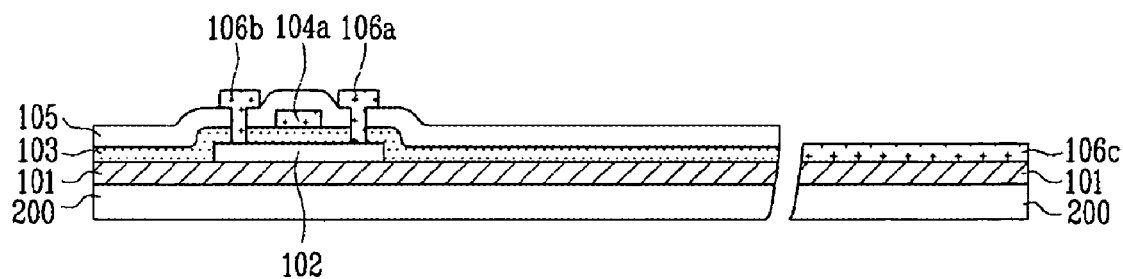

Referring to FIG. 5d, a between-layer insulating film 105 is formed on the upper surface of the pixel region 210 including the gate electrode 104a. Contact holes are formed through which parts of the semiconductor layer 102 are exposed by patterning the between-layer insulating film 105 and gate insulating film 103, and a source electrode 106a and a drain electrode 106b are formed to be connected through the contact holes to the semiconductor layer 102. On the pixel region 210 is formed a scan line connected to the gate electrode 106a and on the non-pixel region 220 are formed a scan line 106 extended from the scan line 106 of the pixel region 210 and a pad 104c to receive signals from the exterior. The source and drain electrodes 106a and 106b, data line 106c and pad 106d are made of metals such as Mo, W, Ti, Al, and/or alloys thereof, and formed as a stacking structure. The non-pixel region 220 of FIG. 5d is a sectional surface of a part formed with the data line 106c.

Figure 5E:
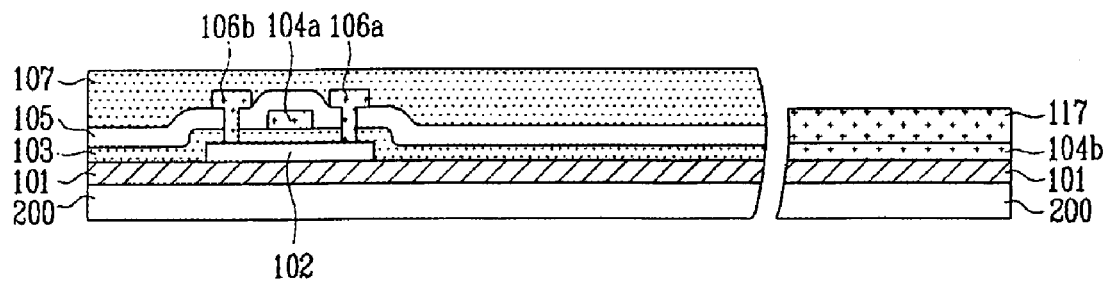
Figure 5F:
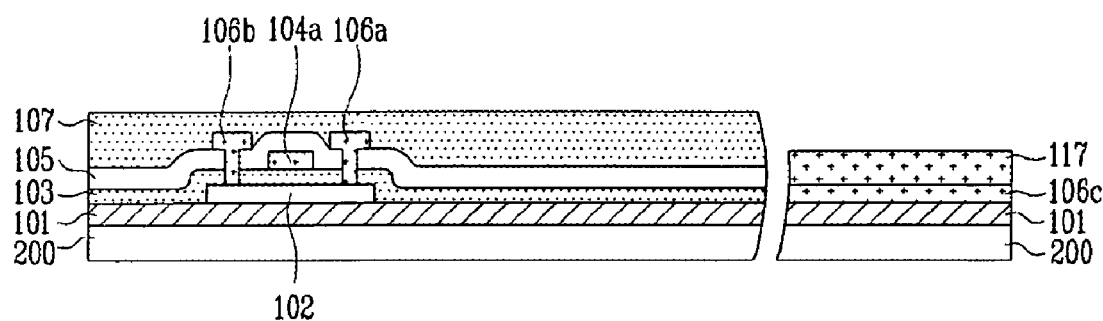
Figure 6B:
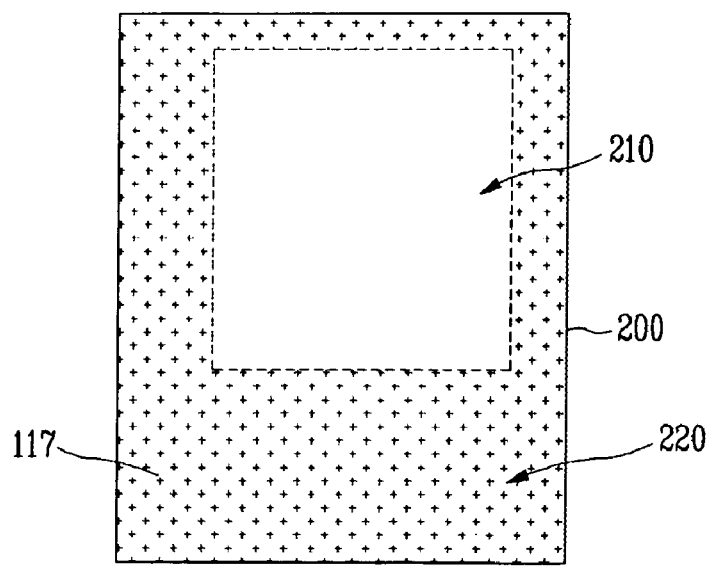

Referring to FIGS. 5e and 5f and FIG. 6b, a flattened layer 107 is formed on the upper surface of the pixel region 210 to flatten the surface. A reflective layer 117, which is formed of a metal having low heat absorption ratio and high reflectivity, is formed on the upper surface of the non-pixel region 220 including the scan line 104b, data line 106c and power supply line.

In another embodiment, it is also possible to form the reflective layer 117 made of a metal having low heat absorption ratio and high reflectivity on the upper surface of the non-pixel region 220 including the scan line 104b, data line 106c and power supply line, and then to form a flattened layer 107 on the upper surface of the pixel region 210 to flatten the surface.

A single layer or stacking structure of metals having low heat absorption ratio and high reflectivity, for example, such as metals selected from a group comprising Cu, Au, Al, Ag, etc, and/or alloys of these metals may be used. For the reference, the reflectivity of Cu, Au, Al, and Ag is Cu(0.976), Au(0.986), Al(0.868), and Ag(0.969), respectively. The non-pixel region 220 of FIG. 5e is a sectional surface of a part formed with the scan line 104b, and the non-pixel region 220 of FIG. 5f is a sectional surface of a part formed with the data line 106c.

Although the above embodiment forms the flattened layer 107 only on the pixel region 210, it is also possible of the flattened layer 107 to remain on the non-pixel region 220. In addition, it is possible of pads 104c and 106d to be exposed in the procedure of patterning so that the reflective layer 117 is formed only on the non-pixel region 220 after forming the reflective region 117 on the upper surface.

Figure 5G:
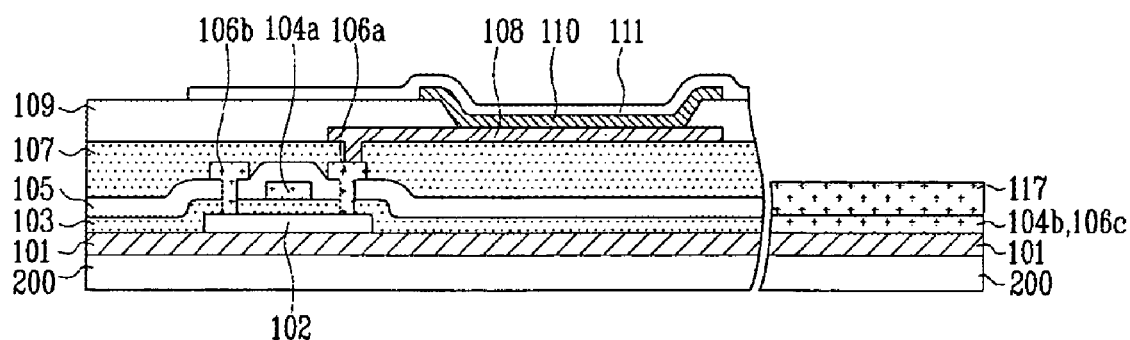

Referring to FIG. 5g, a via hole is formed through which parts of the source or drain electrode 106a or 106b are exposed by patterning the flattened layer 107 of the pixel region 210. An anode electrode 108 is formed to be connected through the via hole to the source or drain electrode 106a or 106b. A pixel definition film 109 is formed on the flattened layer 107 so that a part of the anode electrode 108 is exposed. An organic thin film 110 is formed on the exposed anode electrode 108 and a cathode electrode 111 is formed on the pixel definition film 109 including the organic thin film layer 110 to complete the organic electroluminescence element 100.

In one embodiment the scan line 104b, data line 106c and power supply line are not exposed by the reflective layer 117. Although a construction is suggested where the reflective layer 117 is formed on the surface of the non-pixel region 220 including the scan line 104b, data line 106c and power supply line, it is also possible to implement a construction where the reflective layer 117 is formed only on the scan line 104b, data line 106c and power supply line of the non-pixel region 220.

Turning again to FIGS. 3a and 3b, a encapsulation substrate 300 is provided whose size is such an extent that a part of the pixel region 210 is superposed to a part of the non-pixel region 220. A substrate made of a transparent material such as glass is employed as the encapsulation substrate 300, and in one embodiment a substrate made of silicon oxide SiO2 is employed.

The frit 320 is formed along the surrounding of the encapsulation substrate 300. The frit 320 encapsulates the pixel region 210 to inhibit oxygen and moisture from being penetrated therein, which is formed to surround a part of the non-pixel region 220 including the pixel region 210.

In certain embodiments, the frit is generally as a powder-type glass material and in other embodiments provide a paste state of frit. A laser and/or infrared light absorber, an organic binder, a filler for reducing the thermal expansion coefficient, etc., can be provided. The frit is cured after a firing process. For example, a frit may include at least one kind of transition metal dopant.

Figure 7:
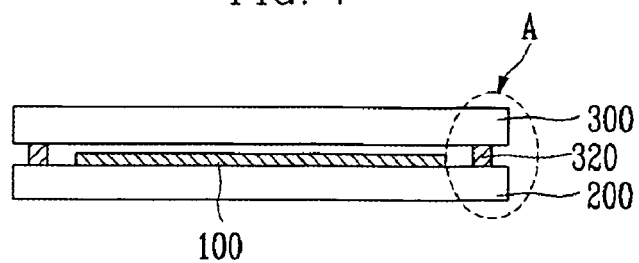

Referring to FIG. 7, the encapsulation substrate 300 is arranged on the upper side of the substrate 200 manufactured through processes shown in FIGS. 5a through 5g. The frit 320 is attached to the substrate 200 by irradiating laser beam and/or infrared ray along the frit 320 under a condition where the encapsulation substrate 300 is arranged on the upper side of the substrate 200 to be superposed to the pixel region 210 and a part of the non-pixel region 220. The laser beam or infrared ray is absorbed to the frit 320, which in turn generates heat, and thereby the frit 320 is fused and attached to the substrate 200.

In one embodiment using the laser, the laser beam is irradiated on the order of power of 36 W to 38 W, and is moved in a substantially constant speed along the frit 320 so as to sustain a constant fusion temperature and adhesive strength. The movement speed of the laser or infrared ray is on the order of 10 to 30 mm/sec, and in one embodiment approximately, 20 mm/sec.

Although one embodiment describes a case where the gate insulating film 103 and between-layer insulating film 105 are formed only on the pixel region 210, it is also possible to form them on the pixel region 210 and non-pixel region 220. In addition, although the description is made with respect to a case where the reflective layer 117 is formed before and after forming the flattened layer 107 as shown in FIG. 5e, it is also possible to form the reflective layer 117 of a metal having low heat absorption ratio and high reflectivity on the upper surface of the non-pixel region 220 including the scan line 104b, data line 106c and power supply line after forming the organic electroluminescence element 100 as shown in FIG. 5g. And, although the embodiment has been described with respect to a case where the frit 320 is formed to seal only the pixel region 210, it is not limited thereto, but may be formed to include the scan driver 410. In that case, the size of the encapsulation substrate 300 should also be changed. In addition, a case has been described where the frit 320 is formed on the encapsulation substrate 300, it is not limited thereto, but may also be formed on the substrate 200.

Figure 8A:
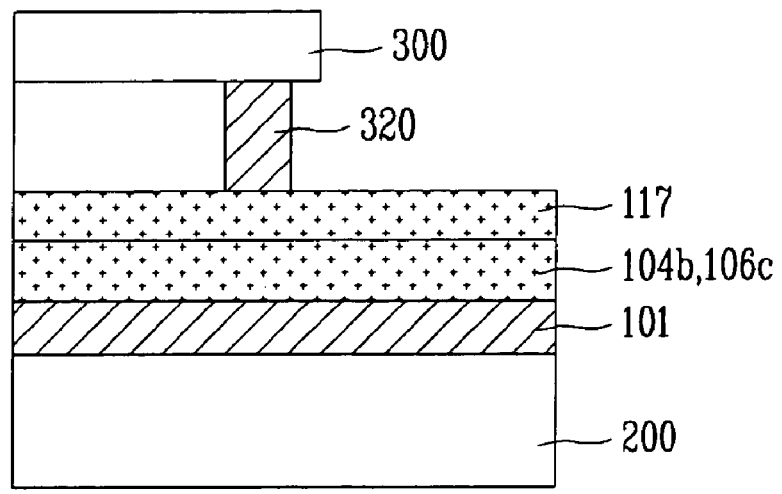
FIGS. 8a and 8b are an enlarged sectional view and a plane view of region 'A' circled in FIG. 7.
Figure 8B:
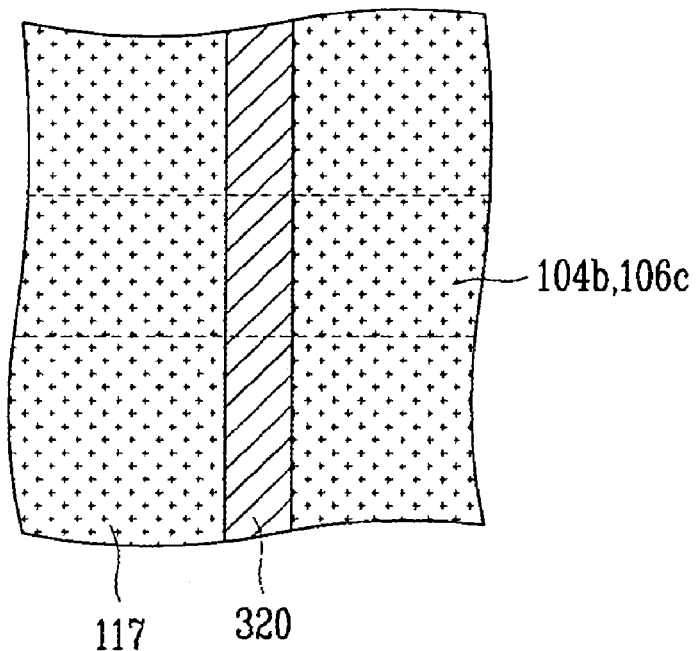

The organic electroluminescence display device according to one embodiment forms the reflective layer 117 with a metal having low absorption ratio and high reflectivity on the upper side of metal wirings such as the scan line 104b, data line 106c and power supply line of the non-pixel region 220. Therefore, when a laser beam is irradiated to fuse and attach the frit 320 to the substrate 200, metal wirings such as the scan line 104b, data line 106c and power supply line placed in a lower side of the frit 320 and a part intersecting the frit 320 fail to be directly exposed to heat due to the laser beam as shown in FIGS. 8a and 8b. A part of laser beam or infrared ray passing through the frit 320 is reflected by the reflective layer 117 and heat generated from the frit 320 is not absorbed well in the reflective layer 117. This in turn reduces heat transfer to the metal wirings, making it possible to inhibit damage to the metal wirings due to heat. Therefore, cracks of the metal wirings or substantial variations of self resistance and electrical property are inhibited, thereby making it possible to sustain electrical property and reliability of elements.

Although one embodiment has been described with respect to a manufacturing method of an active matrix-type organic electroluminescence display device including a thin film transistor for controlling the operation of the organic electroluminescence element 100, with the organic electroluminescence element 100 connected in a matrix type between the scan line 104b and data line 106c, it is also possible to manufacture a passive matrix-type organic electroluminescence display device with the organic electroluminescence element 100 connected in a matrix type between the scan line 104b and data line 106c, using the above embodiment. Another embodiment including a manufacturing method of a passive matrix-type organic electroluminescence display device, will be described below with reference to FIGS. 9a through 9c.

Figure 9A:
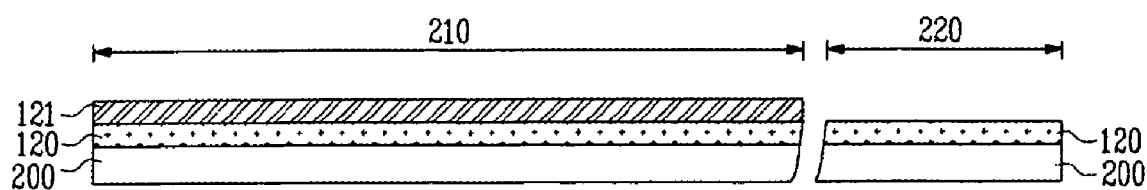
FIGS. 9a through 9c are plan views illustrating a manufacturing method of an organic electroluminescence display device according to another embodiment.

Referring to FIG. 9a, a conductive material such as Cr, W, Ti, ITO is deposited on the upper surface of the substrate 200, and then patterned to form a wiring 120 on the substrate 200 of the non-pixel region 220. The wiring 120 is formed on the pixel region 210 and non-pixel region 220 of the substrate 200. An anode electrode 121 is formed on the pixel region 210 or wiring 120 of the substrate 200. Before forming the wiring 120, a buffer layer (not shown) may be formed on the pixel region 120 and non-pixel region 220 of the substrate 200, which is made of an insulating film such as silicon oxide film SiO2 and/or silicon nitride SiNx.

Figure 9B:
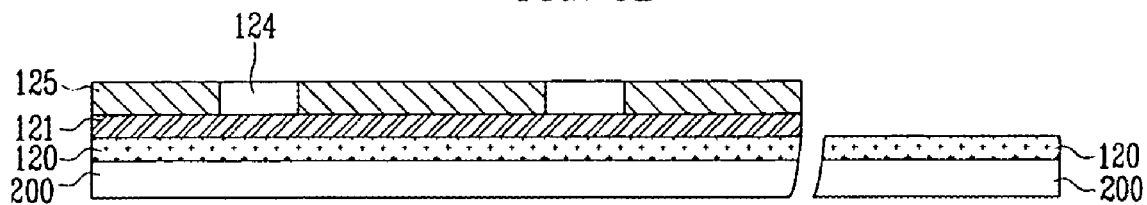

Referring to FIG. 9b, after forming the insulating film 124 on the upper surface of the pixel region 120, the insulating film 124 is patterned so that a part of the anode electrode 121 is exposed, defining a pixel. An organic thin film layer 125 is formed on the exposed anode electrode 121.

Figure 9C:
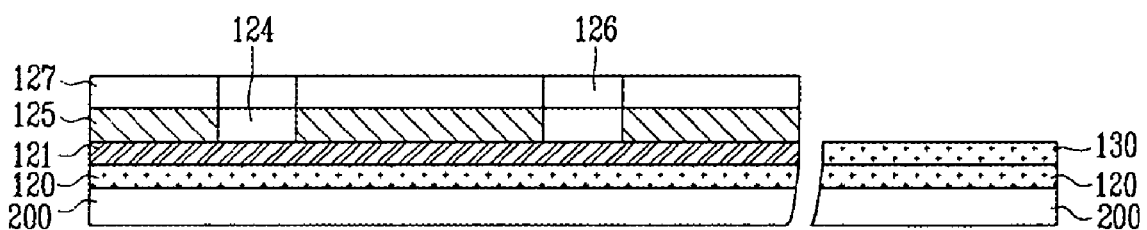

Referring to FIG. 9c, a separation film 126 is formed on the upper surface of the pixel region 120, and then it is patterned so that the organic thin film layer 125 is exposed. A cathode electrode 127 is formed on the organic thin film layer 125 to thereby complete the organic electroluminescence element 100. A reflective layer 130 is formed with a metal having low absorption ratio and high reflectivity on the upper surface of the non-pixel region 220 including the wiring 120. A patterning is made so that the reflective layer 130 remains only on the wiring 120. A single layer or stacking structure of metals having low heat absorption ratio and high reflectivity, for example, such as metals selected from a group comprising Cu, Au, Al, Ag, etc, or an alloy of the metals may be used.

The procedures hereinafter set forth, i.e. preparing the encapsulation substrate 300 and attaching the encapsulation substrate 300 to the substrate 100 have been described above with reference to FIGS. 3a and 3b, and FIG. 7, and thus their detailed description will be omitted.

Figure 10A:
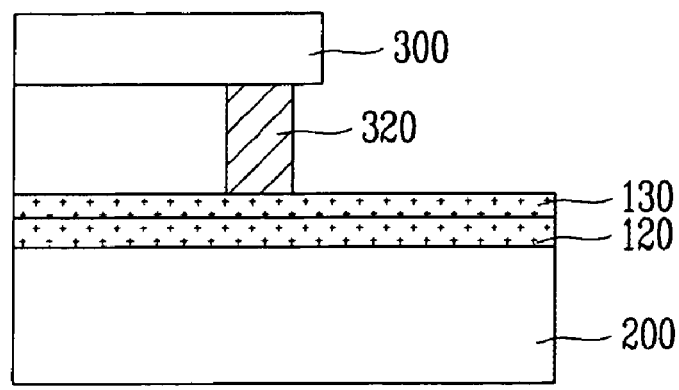
FIGS. 10a and 10b are an enlarged sectional view and a plane view of region 'A' circled in FIG. 7.
Figure 10B:
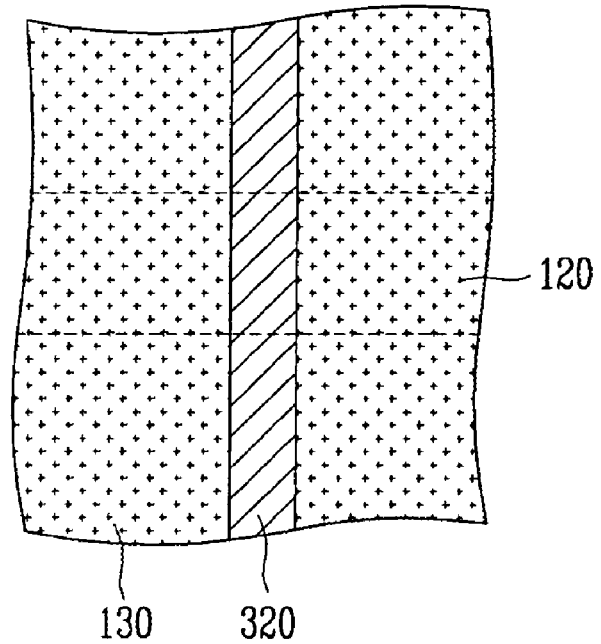

The organic electroluminescence display device according to this embodiment forms the reflective layer 130 with a metal having low absorption ratio and high reflectivity on the upper side of the wiring 120 of the non-pixel region 220. Therefore, when a laser beam is irradiated to fuse and attach the frit 320 to the substrate 200, the wiring 120 of a lower side of the frit 320 and a part intersecting the frit 320 are less directly exposed to heat due to the laser beam as shown in FIGS. 10a and 10b. A part of laser beam or infrared ray passing through the frit 320 is reflected by the reflective layer 130 and heat generated from the frit 320 is not absorbed well in the reflective layer 130, which in turn reduced heat transfer to the wiring 120, making it possible to inhibit damage to the wiring 120 due to heat. Therefore, cracks of the wirings or substantial variation of self resistance and electrical properties are reduced, thereby making it possible to sustain electrical property and reliability of elements.

Figure 11A:
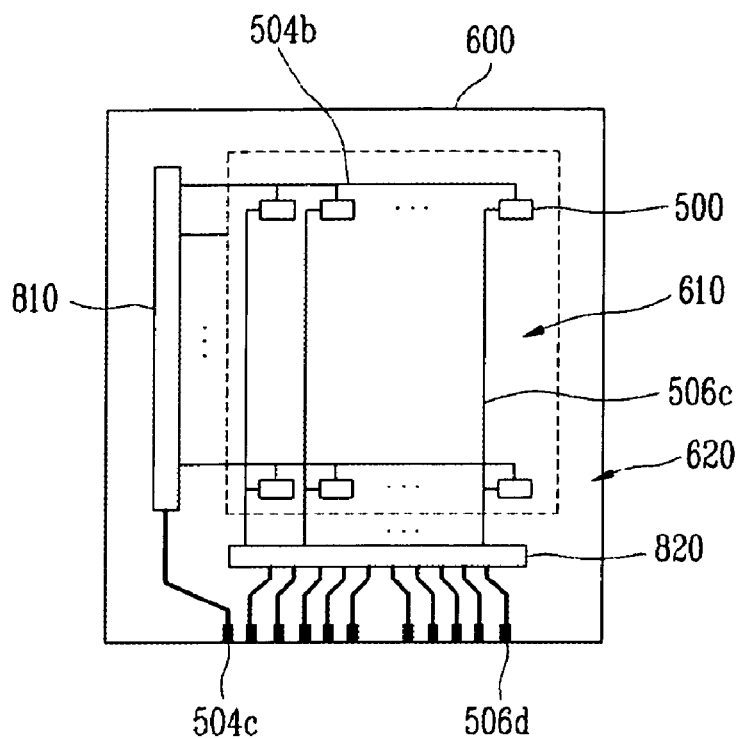
FIGS. 11a, 12a and 13 are plan views illustrating an organic electroluminescence display device according to a further
Figure 11B:
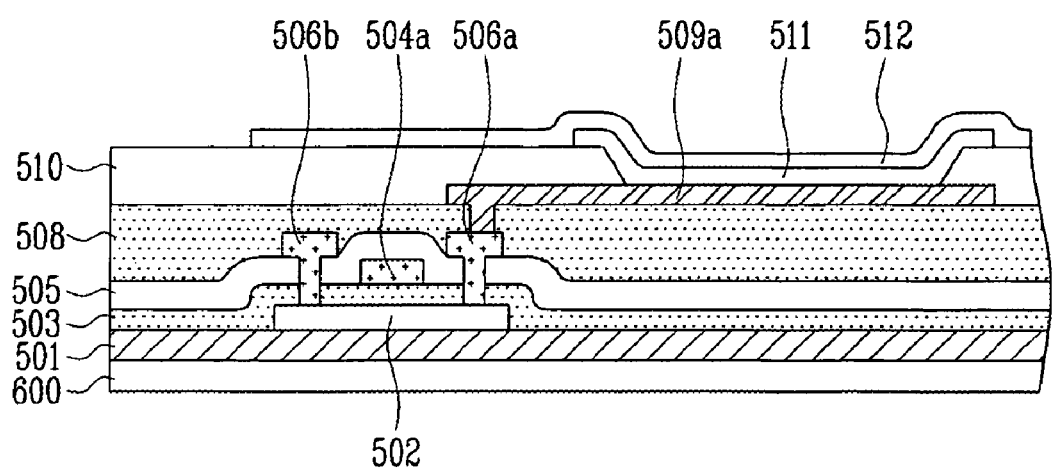
Figure 12A:
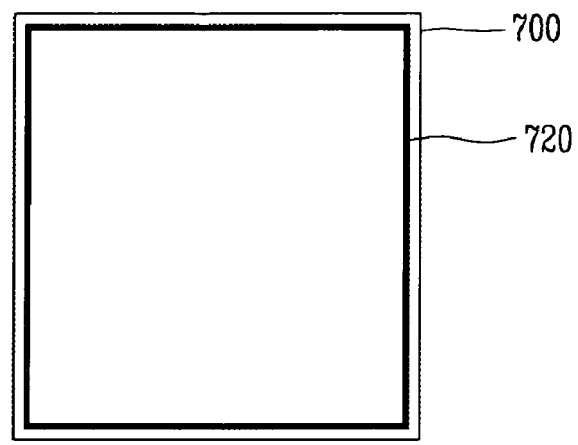
Figure 12B:
Figure 13:
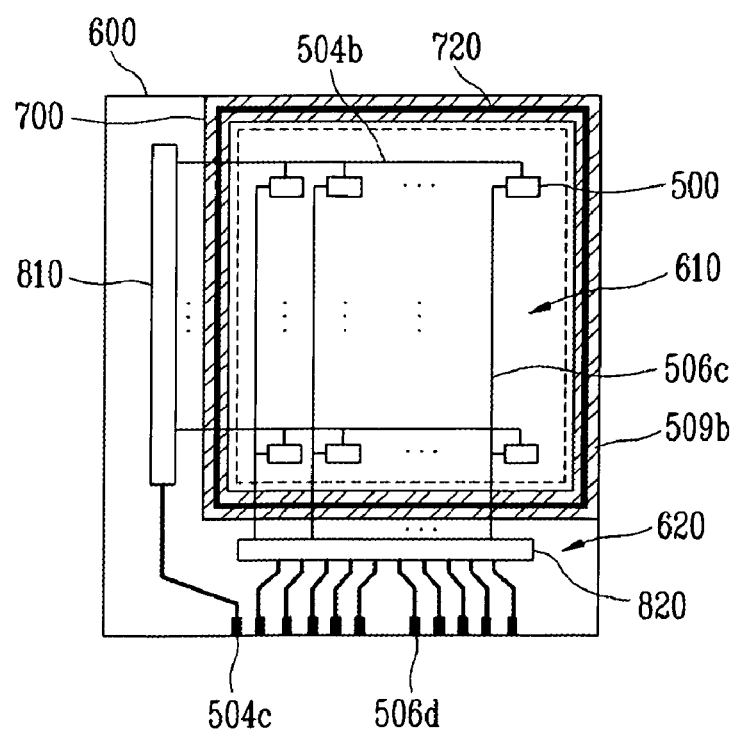

FIGS. 11a, 12a and 13 are plan views of illustrating an organic electroluminescence display device according to a third embodiment of the invention, and FIGS. 11b and 12b are sectional views for illustrating FIGS. 11a and 12a.

Referring to FIG. 11a, a substrate 600 is divided into a pixel region 610 and a non-pixel region 620. The non-pixel region 620 may be a region surrounding the pixel region 610 or a remaining region except for the pixel region 610. Multiple organic electroluminescence elements 500 are formed between a scan line 504b and a data line 506c on the pixel region 610 of the substrate 600, and on the non-pixel region 620 of the substrate 600 are formed a scan line 504b and a data line 506c extended from the scan line 504b and the data line 506c, respectively, of the pixel region 610, a power supply line (not shown) for generating the organic electroluminescence elements 500, and a scan driver 810 and a data driver 820 for processing signals from the exterior through pads 504c and 506d and supplying them to the scan line 504b and data line 506c.

Referring to FIG. 11b, the organic electroluminescence element 500 is composed of an anode electrode 509a and cathode electrode 512, and an organic thin film layer 512 formed between the anode electrode 509a and cathode electrode 511. The organic thin film layer 511 is formed as a structure in which an hole transport layer, an organic light-emitting layer and an electron transport layer are deposited, and may further comprise an hole injection layer and an electron injection layer.

In a passive matrix type, the organic electroluminescence element 500 as configured above is connected in a matrix form between a scan line 504b and a data line 506c, and in an active matrix type, the organic electroluminescence element 500 is connected in a matrix form between the scan line 504b and data line 506c, the active matrix type further comprising a thin film transistor (TFT) for controlling the organic electroluminescence element 500 and a capacitor for sustaining a signal. The thin film transistor comprises a source, a drain and a gate. A semiconductor layer 502 provides a source and drain regions, to which a source and drain electrodes 506a and 506b, and a channel region, on an upper side of which is a gate electrode 504a electrically insulated from the semiconductor layer 503 by a gate insulation film 502.

Referring to FIGS. 12a and 12b, on the encapsulation substrate 700 is formed a frit 720 along the surrounding of the encapsulation substrate 700. The frit 720 encapsulates the pixel region 610 to inhibit oxygen and moisture from penetrating therein, and is formed to surround a part of the non-pixel region 620 including the pixel region 610 and may be formed of a material, for example, such as a glass frit with at least one kind of transition metal dopant, which may be fused by laser beam and/or infrared ray.

Referring to FIG. 13, the encapsulation substrate 700 is arranged on the upper side of the substrate 600. The encapsulation substrate 700 is arranged on the upper side of the substrate 600 so as to be superposed to the pixel region 610 and a part of the non-pixel region 620. A reflective layer 507 and a protective film 509b are provided in a stacking structure between the frit 720 and the scan line 504b, data line 506c and the power supply line formed on the non-pixel region 620. The reflective layer 507 is formed as a single layer or a stacking structure of metals selected from a group, for example, Cu, Au, Al, Ag, etc. having low heat absorption ratio and high reflectivity, or an alloy of the metals. The protective film 509b is formed of an opaque inorganic electrode material in the front surface light emitting type, and a transparent inorganic electrode material in the back surface light emitting type. The opaque inorganic electrode material may be an inorganic material selected from a group comprising, for example, ACX(alloy of Al), Ag, and Au, or a mixture thereof, and the transparent inorganic electrode may be an inorganic material selected from a group comprising, for example, ITO, IZO, and ITZO, or a mixture thereto.

The reflective layer 507 and protective film 509b may be formed on the surface of the non-pixel region 620. If the protective film 509b is allowed to be formed in the procedure where the anode electrode 509a is formed, it can be formed without additional process steps and mask. In a case where the protective film 509b and anode electrode 509a are formed of the inorganic electrode material, it should be separated from the anode electrode 509a for the electrical isolation between the scan line 504b and data line 506c and the anode electrode 509a.

A laser beam and/or infrared ray is irradiated under a condition where the encapsulation substrate 700 is attached onto the substrate 600, such that the frit 720 is fused and bonded to the substrate 600.

A manufacturing method of an organic electroluminescence display device configured as above will be described below with reference to FIGS. 14a through 14h and FIGS. 15a and 15b in accordance with yet another embodiment.

Figure 14A:
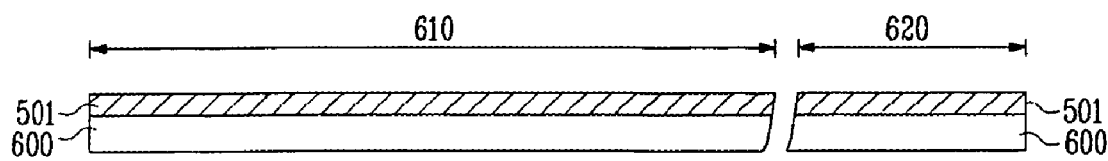
FIGS. 14a through 14h and FIG. 16 are sectional views of illustrating a manufacturing method of an organic electroluminescence display device according to a further embodiment.
Figure 15A:
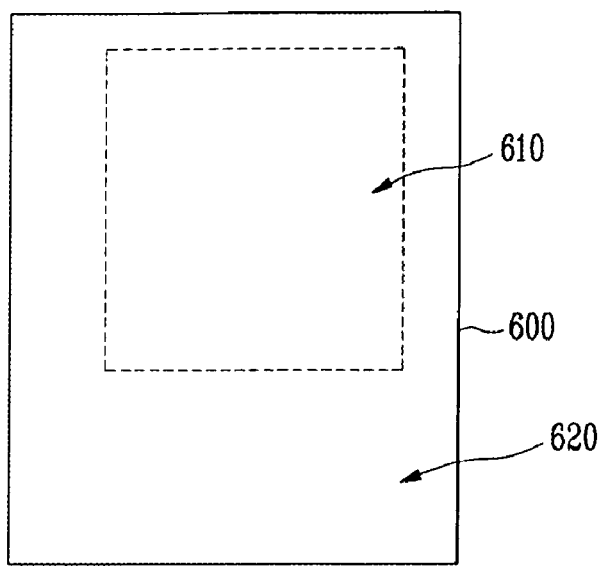
FIGS. 15a and 15b are plan views for illustrating FIGS. 14a and 14g.

Referring to FIGS. 14a and 15a, firstly, a substrate 600 is prepared, on which a pixel region 610 and a non-pixel region 620 are defined. The non-pixel region 620 may be defined as a region surrounding the pixel region 610 or a peripheral region of the pixel region 610.

A buffer layer 501 is formed on the pixel region 610 and non-pixel region 620 of the substrate 600. The buffer layer 501, which serves to inhibit the damage to the substrate 600 due to heat and isolate diffusion of ions from the substrate 600 to the outside, is formed as an insulating film such as silicon oxide film SiO2 and/or silicon nitride film SiNx.

Figure 14B:
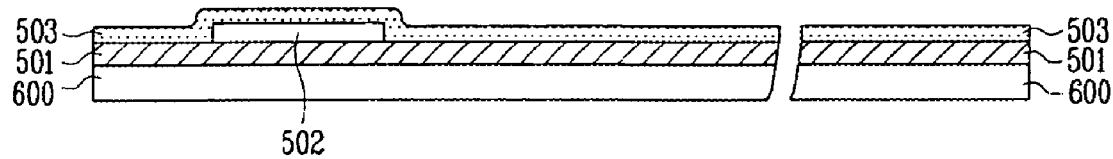

Referring to FIG. 14b, a semiconductor layer 501, which provides an active layer, is formed on the buffer layer 502 of the pixel region 610, and then a gate insulating film 502 is formed on the upper surface of the pixel region 610 and non-pixel region 620 including the semiconductor layer 503. The semiconductor layer 502 provides a source and drain regions and a channel region for a thin film transistor.

Figure 14C:
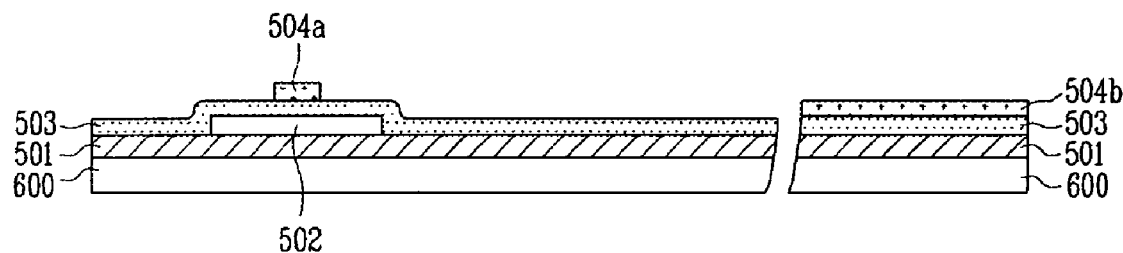

Referring to FIG. 14c, a gate electrode 504a is formed on the gate insulating film 502 placed on the upper side of the semiconductor layer 503. At this time, on the pixel region 610 is formed a scan line connected to the gate electrode 504a and on the non-pixel region 620 are formed a scan line 504b extended from the scan line 504b of the pixel region 610 and a pad 504c to receive signals from the exterior. The gate electrode 504a, scan line 504b and pad 504c are made of metals such as Mo, W, Ti, Al, or alloy thereof, and formed as a stacking structure. The non-pixel region 620 of FIG. 14c is a sectional surface of a part formed with the scan line 504b.

Figure 14D:
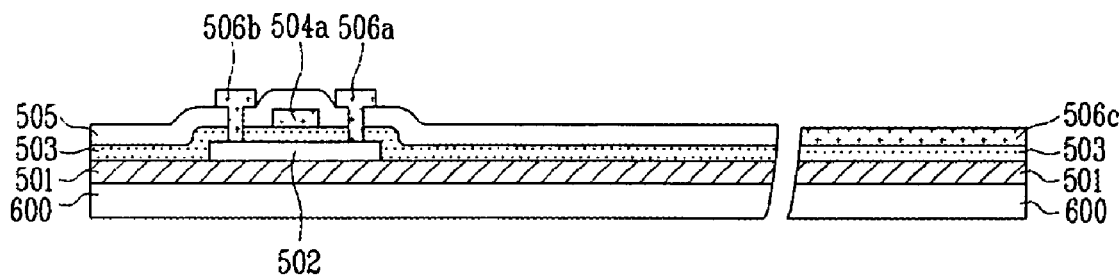

Referring to FIG. 14d, a between-layer insulating film 505 is formed on the upper surface of the pixel region 610 including the gate electrode 504a. Contact holes are formed through which parts of the semiconductor layer 503 are exposed by patterning the between-layer insulating film 505 and gate insulating film 502, and a source electrode 506a and a drain electrode 506b are formed to be connected through the contact holes to the semiconductor layer 502. On the pixel region 610 is formed a data line 506c connected to the source and drain electrodes 506a, 506b and on the non-pixel region 620 are formed a data line 506c extended from the data line 506c of the pixel region 610 and a pad 506d to receive signals from the exterior. The source and drain electrodes 506a and 506b, data line 506c and pad 506d are made of metals such as Mo, W, Ti, Al, or alloy thereof, and formed as a stacking structure. The non-pixel region 620 of FIG. 14d is a sectional surface of a part formed with the data line 506c.

Figure 14E:
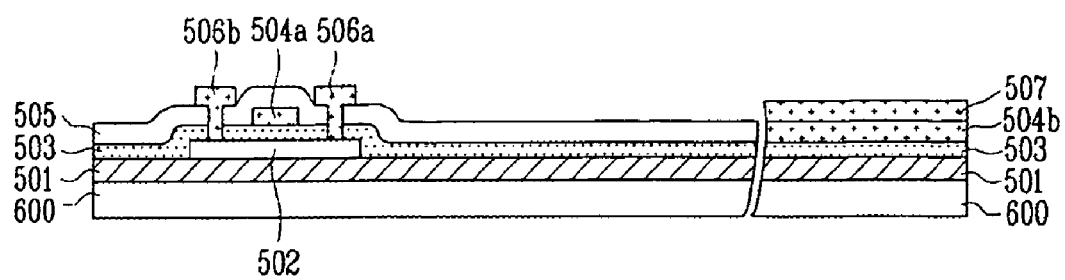
Figure 14F:
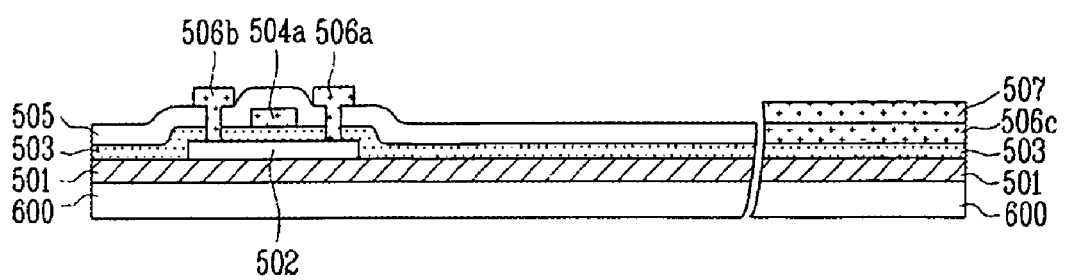

Referring to FIGS. 14e and 14f, the reflective layer 507 is formed on the upper surface of the non-pixel region 620 including the scan line 504b and data line 506c. Although most metals can reflect light, this embodiment employs a single layer or stacking structure of metals having low heat absorption ratio and high reflectivity, for example, such as metals selected from a group comprising Cu, Au, Al, Ag, etc, or an alloy of the metals. For the reference, the reflectivity of Cu, Au, Al, and Ag is Cu(0.976), Au(0.986), Al(0.868), and Ag(0.969), respectively. The non-pixel region 620 of FIG. 14e is a sectional surface of a part formed with the scan line 504b, and the non-pixel region 620 of FIG. 14f is a sectional surface of a part formed with the data line 506c.

Figure 14G:
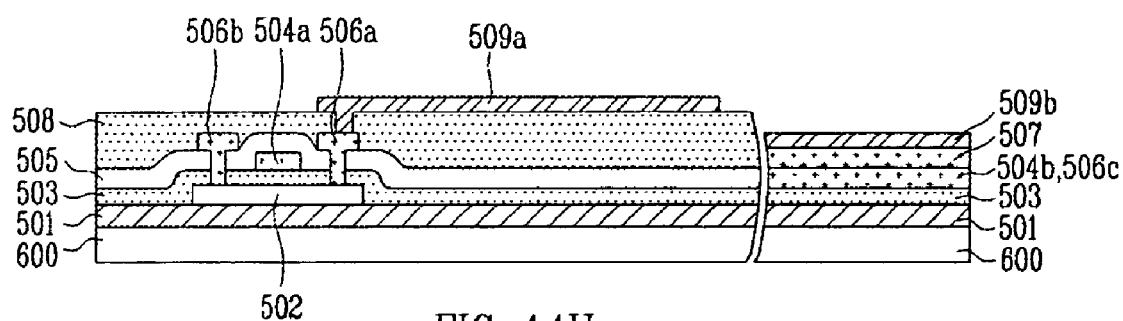
Figure 15B:
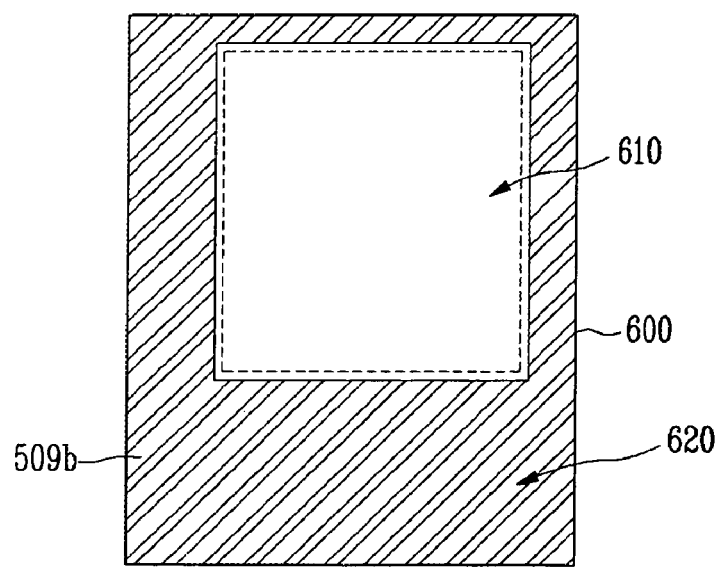

Referring to FIGS. 14g and 15b, a flattened layer 508 is formed on the upper surface of the pixel region 610 to flatten the surface. A via hole is formed through which parts of the source or drain electrode 506a or 506b are exposed by patterning the flattened layer 508 of the pixel region 610. An electrode material layer made of an inorganic material is formed on the upper side of the pixel region 610 and non-pixel region 620. Patterning is made so that on the pixel region 610 is formed the anode electrode 509a, which is connected through the via hole to the source or drain electrode 506a or 506b, and on the non-pixel region 620 is formed the protective film 509b.

The electrode material layer made of an inorganic material may be made of an opaque inorganic material or a mixture of inorganic materials in the case of front surface light emitting type, and a transparent inorganic material or a mixture of inorganic materials in the case of back surface light emitting type. The opaque inorganic material or mixture of inorganic materials may be selected from a group comprising, for example, ACX(alloy of Al), Ag, and Au, and the transparent inorganic or mixture of inorganic materials may be selected from a group comprising, for example, ITO, IZO, and ITZO.

Although this embodiment causes the protective film 509b to be formed during the procedure when the anode electrode 509a is formed, so that additional processes and mask will not required, it is also possible to form the anode electrode 509a and the protective film 509b through separate processes. However, in a case where the anode electrode 509a and the protective film 509b are formed of an inorganic electrode material in the same process steps, the anode electrode 509a and the protective film 509b are preferably separated from each other for the electrical isolation between the scan line 504b and data line 506c and the anode electrode 509a.

Figure 14H:
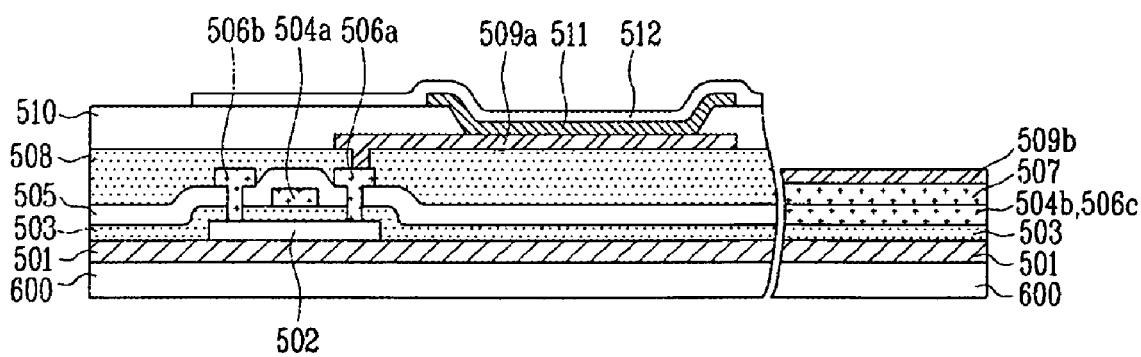

Referring to FIG. 14h, a pixel definition film 510 is formed on the flattened layer 508 so that a part of the anode electrode 509a is exposed, and then an organic thin film 511 is formed on the exposed anode electrode 509a and a cathode electrode 511 is formed on the pixel definition film 510 including the organic thin film layer 512.

This embodiment suggested a construction where the scan line 504b, data line 506c and power supply line are not exposed by the reflective layer 507 and protective film 509b. Although a construction is suggested where the reflective layer 507 and protective film 509b are formed on the surface of the non-pixel region 620 including the scan line 504b, data line 506c and power supply line, it is also possible to implement a construction where the reflective layer 507 and protective film 509b are formed only on the scan line 504b, data line 506c and power supply line of the non-pixel region 620.

Turning again to FIGS. 12a and 12b, a encapsulation substrate 700 is provided whose size is such an extent that a part of the pixel region 610 is superposed to a part of the non-pixel region 620. A substrate made of a transparent material such as glass is employed as the encapsulation substrate 700, and preferably a substrate made of silicon oxide $SiO_2$ is employed.

The frit 720 is formed along the surrounding of the encapsulation substrate 700. The frit 720 encapsulates the pixel region 610 to inhibit oxygen and moisture from being penetrated therein, which is formed to surround a part of the non-pixel region 620 including the pixel region 610. The frit 720 is in one embodiment a powder-type glass material. In other embodiments a paste state of frit, which includes a laser or infrared light absorber, an organic binder, a filler for reducing the thermal expansion coefficient, etc., is cured after a firing process. For example, a frit may include at least one kind of transition metal dopant.

Figure 16:
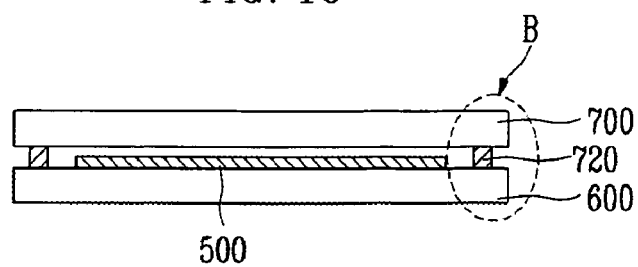

Referring to FIG. 16, the encapsulation substrate 700 is arranged on the upper side of the substrate 600 manufactured through processes shown and described with respect to FIGS. 14a through 12h. The frit 720 is attached to the substrate 700 by irradiating a laser beam and/or infrared ray along the frit 720 under a condition where the encapsulation substrate 700 is arranged on the upper side of the substrate 600 to be superposed to the pixel region 610 and a part of the non-pixel region 620. The laser beam or infrared ray is absorbed to the frit 720, which in turn generates heat, and thereby the frit 720 is fused and attached to the substrate 600.

In one embodiment using the laser, the laser beam is irradiated on the order of power of 36 W to 38 W, and is moved at a substantially constant speed along the frit 720 so as to sustain a substantially constant fusion temperature and adhesive strength. In one embodiment, movement speed of the laser or infrared ray is on the order of 10 to 30 mm/sec, and preferably, approximately 20 mm/sec.

On the other hand, although this embodiment has been described with respect to a case where the frit 720 is formed to seal only the pixel region 610, it is not limited thereto, but may be formed to include the scan driver 810. In that embodiment, the size of the encapsulation substrate 700 should also be changed. In addition, a case has been described where the frit 720 is formed on the encapsulation substrate 700, it is not limited thereto, but may also be formed on the substrate 600.

Figure 17A:
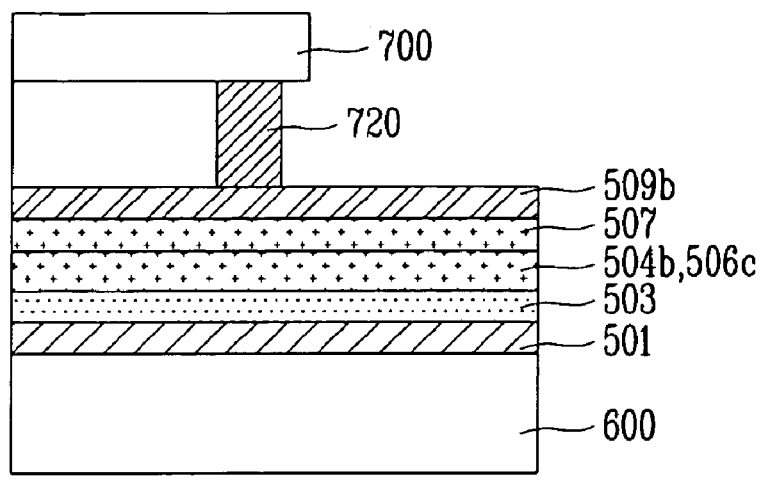
FIGS. 17a and 17b are an enlarged sectional view and a plan view of region 'B' circled in FIG. 16.
Figure 17B:
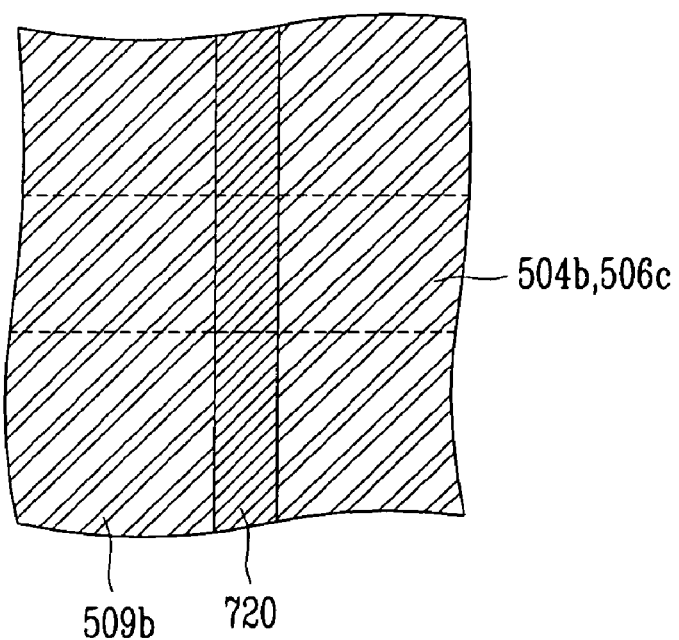

The organic electroluminescence display device according to this embodiment forms the reflective layer 507 and the protective film 509b to have a stacking structure on the metal wirings such as the scan line 504b, data line 506c and power supply line of the non-pixel region 620. Therefore, when a laser beam and/or infrared ray are irradiated to fuse and attach the frit 720 to the substrate 600, the metal wirings 504b, 506c of a lower side of the frit 720 and a part intersecting the frit 720 are less directly exposed to heat due to the laser beam or infrared ray as shown in FIGS. 17a and 17b. The protective film 509b made of an inorganic electrode material reflects laser beam or infrared ray to inhibit heat from being absorbed. The reflective layer 507 made of a metal having low absorption ratio and high reflectivity reflects a part of laser beam or infrared ray passing through the protective film 509b and screen heat from being transferred from the protective film 509b to the metal wirings 504b, 506c.

Reflectivity of the metals generally used as electrodes or wirings is Cr(0.632), Mo(0.550), Ti(0.557), and W(0.500) in the wavelength bandwidth of infrared (IR) ray, but reflectivity of the opaque inorganic electrode materials used for the embodiment is relatively high such as Al(0.868), Ag(0.969), Au(0.986), etc. Accordingly, since heat absorption ratio is low due to the high reflectivity, the amount of heat transferred to the metal wirings of the lower side may be significantly lowered. In addition, the transparent inorganic electrode materials (ITO, IZO, ITZO, etc.) used in certain embodiments, which are metal oxide, have even lower heat conductivity compared to metallic materials, and thus may serve to isolate heat transferred to the metal wirings of the lower side and may serve as a buffer layer, thus making it possible to significantly reduce damage to the metal wiring due to heat. Accordingly, heat transfer is effectively interrupted by the reflective layer 507 and the protective film 509b formed as a double structure and thus possible damage to the metal wirings 504b, 506c due to heat is reduced, which in turn inhibits the cracking of the metal wirings or substantial variations of self resistance and electrical properties, thereby making it possible to sustain electrical property and reliability of elements.

In addition, since the second protective film 509b is formed of an inorganic material having outstanding adhesive strength with the frit on the metal wirings 504b, 506c of the non-pixel region 620 during the procedure of forming the anode electrode 509a without addition of separate processes or mask, it is possible to give even more prominent adhesive strength than the case where the frit is attached directly to the metal wirings 504b, 506c. Thus, the adhesive strength is enhanced between the frit 720 and substrate, which in turn inhibits the penetration of oxygen or moisture effectively, thereby improving reliability of the display device.

Although embodiments of the invention have been shown and described, it would be appreciated by those skilled in the art that changes can be made in these embodiments without departing from the principles and spirit of the invention, the scope of which is defined in the claims and their equivalents.

What is claimed is:

1. An organic electroluminescence display device comprising:
   a first substrate formed with an organic electroluminescence element,
   a metal wiring for conducting signals to the organic electroluminescence element,
   a second substrate arranged on an upper side of the first substrate,
   a fit provided between the first substrate and the second substrate, and
   a reflective layer formed between the metal wiring and the frit.

2. The organic electroluminescence display device as claimed in claim 1, wherein at least either one of the first substrate and the second substrate comprises a transparent material.

3. The organic electroluminescence display device as claimed in claim 1, wherein the metal wiring comprises a scan line, a data line, and a power supply line.

4. The organic electroluminescence display device as claimed in claim 1, wherein the reflective layer is further formed on a remaining region excluding a region formed with the organic electroluminescence element.

5. The organic electroluminescence display device as claimed in claim 1, wherein the reflective layer is formed of one or more selected from a group consisting of Cu, Au, Al, and Ag.

6. The organic electroluminescence display device as claimed in claim 1, wherein the frit comprises at least one dopant made of transition metal.

7. The organic electroluminescence display device as claimed in claim 1, further comprising a transistor for controlling the operation of the organic electroluminescence element.

8. The organic electroluminescence display device as claimed in claim 1, further comprising a protective film formed on the reflective layer.

9. The organic electroluminescence display device as claimed in claim 1, wherein the frit comprises one or more materials selected from the group consisting of magnesium oxide (MgO), calcium oxide (CaO), barium oxide (BaG), lithium oxide (Li2O), sodium oxide (Na2O), potassium oxide (K2O), boron oxide (B2O3), vanadium oxide (V2O5), zinc oxide (ZnO), tellurium oxide (TeO2), aluminum oxide (Al2O3), silicon dioxide (SiO2), lead oxide (PbO), tin oxide (SnO), phosphorous oxide (P2O5), ruthenium oxide (Ru2O), rubidium oxide (Rb2O), rhodium oxide (Rh2O), ferrite oxide (Fe2O3), copper oxide (CuO), titanium oxide (TiO2), tungsten oxide (WO3), bismuth oxide (Bi2O3), antimony oxide (Sb2O3), lead-borate glass, tin-phosphate glass, vanadate glass, and borosilicate.

10. A manufacturing method of an organic electroluminescence display device, method comprising:
    providing an organic electroluminescence element on a pixel region of a first substrate and providing a wiring connected to the organic electroluminescence element on a non-pixel region of the first substrate,
    providing a reflective layer on an upper surface of the non-pixel region including the wiring,
    forming a fit along a surrounding of the second substrate, and
    arranging the second substrate on an upper side of the first substrate and attaching the frit to the first substrate.

11. The manufacturing method of an organic electroluminescence display device as claimed in claim 10, further comprising:
    providing a first electrode on the first substrate of the pixel region,
    providing an insulating film on an upper side of the pixel region,
    patterning the insulating film so that at least a part of the first electrode is exposed to define a pixel,
    providing an organic thin film layer on the exposed first electrode,
    providing a separation film on the upper side of the pixel region and patterning the separation film so that the organic thin film layer is at least partially exposed, and
    providing a second electrode on the organic thin film layer.

12. The manufacturing method of an organic electroluminescence display device as claimed in claim 10, wherein the wiring is formed of one or more selected from a group consisting of Cr, Mo, Ti and ITO.

13. The manufacturing method of an organic electroluminescence display device as claimed in claim 10, further comprising:
    after providing the reflective layer, patterning so that the reflective layer remains substantially only on the wiring.

14. The manufacturing method of an organic electroluminescence display device as claimed in claim 10, wherein the frit is fused and attached to the first substrate by irradiation with at least one of a laser beam and infrared ray.

15. The manufacturing method of an organic electroluminescence display device as claimed in claim 10, wherein the frit comprises at least one dopant comprising at least one transition metal.

16. The manufacturing method of an organic electroluminescence display device as claimed in claim 10, further comprising providing a transistor for controlling the organic electroluminescence element.

17. The manufacturing method of an organic electroluminescence display device as claimed in claim 15, further comprising:
    providing a buffer layer on a first substrate including a pixel region and a non-pixel region, providing a semiconductor layer on the buffer layer of the pixel region and providing a gate insulating film on the upper surface of the pixel region including the semiconductor layer, providing a gate electrode and a first metal wiring on the gate insulating film of the pixel region and providing on the buffer layer of the non-pixel region the first metal wiring extended from the first metal wiring of the pixel region, providing a between-layer insulating film on the upper surface of the pixel region including the gate electrode, providing on the between-layer insulating film of the pixel region a source and drain electrodes and a second metal wiring connected to the semiconductor layer and providing on the buffer layer of the non-pixel region the second metal wiring extended from the second metal wiring of the pixel region, providing a flattened layer on the upper surface of the pixel region, and providing on the flattened layer the organic electroluminescence element comprising a first electrode, an organic thin film layer and a second electrode connected to the source and drain electrodes.

18. An organic electroluminescence display device comprising:
  a first substrate formed with an organic electroluminescence element comprising a first electrode, an organic thin film layer and a second electrode and a metal wiring for conducting signals to the organic electroluminescence element,
  a second substrate arranged at a upper side of the first substrate,
  a frit provided between the first substrate and the second substrate,
  a reflective layer provided between the metal wiring and the fit, and
  a protective film formed on the reflective film.

19. The organic electroluminescence display device as claimed in claim 18, wherein the protective film is formed of a first electrode material and separated from the first electrode.

20. The organic electroluminescence display device as claimed in claim 18, further comprising a transistor for controlling the organic electroluminescence element.

21. A manufacturing method of an organic electroluminescence display device comprising:
  providing a buffer layer on a first substrate including a pixel region and a non-pixel region,
  providing a semiconductor layer on the buffer layer of the pixel region and providing a gate insulating film on the upper surface of the non-pixel region,
  providing a gate electrode and a first metal wiring on the gate insulating film of the pixel region and providing on the gate insulating film of the non-pixel region the first metal wiring extended from the first metal wiring of the pixel region,
  providing a between-layer insulating film on the upper surface of the pixel region and providing a contact hole so that a portion of the semiconductor layer is exposed,
  providing on the between-layer insulating film of the pixel region a source and drain electrodes and a second metal wiring connected through the contact hole to the semiconductor layer and providing on the gate insulating film of the non-pixel region the second metal wiring extended from the second metal wiring of the pixel region,
  providing a reflective layer on the upper surface of the non-pixel region including the first and second metal wirings,
  providing a flattened layer on the upper surface of the pixel region and providing a via hole so that the source and drain electrodes are exposed,
  providing an inorganic electrode layer on the upper surface of the pixel region and non-pixel region and then patterning the inorganic electrode layer, with a first electrode formed on the pixel region, the first electrode connected through the via hole to the source or drain electrode, and with a protective film formed on the non-pixel regin,
  providing an organic thin film layer and a second electrode on the first electrode,
  forming a frit along a surrounding of the second substrate, and
  arranging the second substrate on an upper surface of the first substrate and then attaching the frit to the first substrate.

* * * * *